US007362061B2

(12) United States Patent
Yasohara et al.

(10) Patent No.: US 7,362,061 B2
(45) Date of Patent: Apr. 22, 2008

(54) GATE DRIVER, MOTOR DRIVING DEVICE INCLUDING THE GATE DRIVER, AND APPARATUS EQUIPPED WITH THE MOTOR DRIVING DEVICE

(75) Inventors: Masahiro Yasohara, Hyogo (JP); Koji Kameda, Osaka (JP); Kazuaki Sakurama, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 513 days.

(21) Appl. No.: 10/690,061

(22) Filed: Oct. 21, 2003

(65) Prior Publication Data

US 2004/0135528 A1 Jul. 15, 2004

(30) Foreign Application Priority Data

Dec. 20, 2002 (JP) ............................. 2002-370318

(51) Int. Cl.
*H02K 21/00* (2006.01)
(52) U.S. Cl. ...................... 318/254; 318/811; 318/599; 326/27; 326/80; 327/108
(58) Field of Classification Search ...................... None
See application file for complete search history.

(56) References Cited

U.S. PATENT DOCUMENTS

| 4,797,579 A | * | 1/1989 | Lewis ........................... 326/27 |
| 5,081,380 A | * | 1/1992 | Chen ........................... 327/262 |
| 5,214,320 A | * | 5/1993 | Truong ........................ 326/33 |
| 5,514,981 A | * | 5/1996 | Tam et al. .................... 326/80 |
| 5,557,223 A | * | 9/1996 | Kuo ............................ 327/108 |
| 6,008,686 A | * | 12/1999 | Suda ........................... 327/513 |
| 6,043,698 A | * | 3/2000 | Hill ............................. 327/333 |
| 6,236,239 B1 |  | 5/2001 | Kogushi |

(Continued)

FOREIGN PATENT DOCUMENTS

EP 0 423 963 A 4/1991

(Continued)

OTHER PUBLICATIONS

European Search Report for PCT/JP03/12953, dated Jun. 16, 2004.

*Primary Examiner*—Lincoln Donovan
*Assistant Examiner*—Renata McCloud
(74) *Attorney, Agent, or Firm*—RatnerPrestia

(57) ABSTRACT

A gate driver for forcing a power transistor including a gate electrode insulated with oxide film into conduction or shut-off, the gate driver includes a first current source for outputting a first current value to raise an electric potential of the gate electrode for changing shut-off state of the power transistor to conductive state; and a second current source for outputting a second current value to lower the electric potential of the gate electrode for changing the conductive state of the power transistor to the shut-off state. The first current value and the second current value are assigned based on at least one kind of current-source control information. This structure allows preparing an appropriate speed of forcing the power transistor into conduction or shut-off with a small number of elements, and the gate driver can be used with ease for driving power transistors having different output sizes.

10 Claims, 9 Drawing Sheets

U.S. PATENT DOCUMENTS

| | | | |
|---|---|---|---|
| 6,359,797 B1 * | 3/2002 | Bayer et al. | 363/60 |
| 6,437,611 B1 * | 8/2002 | Hsiao et al. | 327/108 |
| 6,469,585 B1 * | 10/2002 | Dai et al. | 331/57 |
| 6,476,654 B2 | 11/2002 | Tanaka | |
| 6,507,226 B2 * | 1/2003 | Swonger et al. | 327/108 |
| 6,714,049 B2 * | 3/2004 | Shenai et al. | 326/82 |

FOREIGN PATENT DOCUMENTS

| | | |
|---|---|---|
| JP | 04-230117 A | 8/1992 |
| WO | WO 97/12443 A | 4/1997 |
| WO | WO 02/45232 A | 6/2002 |

* cited by examiner

GATE DRIVER, MOTOR DRIVING DEVICE INCLUDING THE GATE DRIVER, AND APPARATUS EQUIPPED WITH THE MOTOR DRIVING DEVICE

TECHNICAL FIELD

The present invention relates to a motor driving device suitable for driving the following motors:

paper-feeding motor and scanner motor employed in driving system of printer and copying machine;

spindle motor and head actuator employed in driving system of information apparatus such as optical medium apparatus and hard disc apparatus; blowing-fan motor and compressor motor employed in air-conditioner, refrigerator, and air cleaner;

combustion air-blower motor employed in hot-water supply;

washing-tub driving motor employed in washing machine;

blower motor employed in home appliance such as vacuum cleaner; and brushless DC motor, induction motor, reluctance motor and stepping motor employed in FA apparatus and industrial equipment such as component-mounting machine, industrial robot, general-purpose inverter;

More particularly, the present invention relates to a gate driver suitable for driving a gate electrode of power transistors such as MOSFET (metal oxide semiconductor field-effect transistor), IGBT (insulated-gate bipolar transistor), both including gate-electrodes insulated with oxide film. Because the foregoing motors are driven by a pulse width modulation driving (hereinafter referred to as PWM driving) method, which closely relates to a gate driver of a power transistor.

BACKGROUND ART

Information apparatuses such as printers, copying machines, optical media apparatuses, and hard disc apparatuses have been recently required to operate at a higher speed and also downsized. This market environment urges the motors employed in those apparatuses to output more power in a smaller body, and at the same time, the market requires the motors to save power.

Home appliances such as an air-conditioner, refrigerator, hot-water supply, washing machine, employ AC induction motors therein; however those appliances have recently used brushless DC motors instead of the AC induction motors because the brushless DC motors can operate the appliances more efficiently and save power.

In the industrial field, the motor was simply a power source, however, the motor has been recently required to change its speed and operate more efficiently, so that a motor driven by an inverter as well as a brushless DC motor has gained popularity in the industrial field.

In the FA field, a servo-motor is used for driving a robot or a component mounting machine, so that the servo-motor performs accurate driving at variable speeds or accurate positioning.

Those motors employ, in general, the PWM driving method for the power saving and the variable-speed driving. The PWM driving is achieved by the following method: The power transistors coupled to driving coils of the motor are turned on or off, and the ratio of ON vs. OFF is variably set, so that power-feeding to the driving coils can be controlled. This method is well known as a power-thrifty driving method. This PWM driving method has been employed in various motors of home appliances, FA apparatuses and industrial apparatuses. In addition to those fields, information apparatuses have recently started using motors driven by the PWM driving method due to the market environment discussed above.

The motors driven by the PWM driving method employ power transistors suitable for on-off operations, namely, MOSFET or IBGT in general. One feature of those power transistors is that they include gate electrodes insulated with oxide film.

When the power transistor including the gate electrode insulated with oxide film is changed from off-state to on-state, namely, from shut-off state to conductive state, or changed from on-state to off-state, i.e., from conductive state to shut-off state, the following structure is required: In the case of a fast switching speed (a high dV/dt) at forcing the power transistor into conduction or shut-off, the gate driver for driving the gate electrode of the power transistor is equipped with a pulse filter in order to prevent the gate driver from malfunction due to this fast switching speed. (e.g., refer to Japanese Patent Application Non-Examined Publication No. H04-230117).

A structure, where a power transistor is driven by a gate driver, is shown in FIG. 9 as an example of the prior art. FIG. 9 shows a structure of a conventional gate driver.

In FIG. 9, power transistor 802 is a MOSFET and includes a gate electrode insulated with oxide film. In transistor 802, the gate electrode is driven by gate driver 803, so that transistor 802 shifts to the conductive state from the shut-off state, or vice versa. Gate driver 803 includes transistors 831 and 832 which are alternately turned on and off, so that the gate electrode of transistor 802 becomes a plus or zero volt.

In other words, turning-on of transistor 831 and turning-off of transistor 832 force the gate electrode of transistor 802 to take a plus volt and be conductive. Turning-off of transistor 831 and turning-on of transistor 832 force the gate electrode of transistor 802 to take a zero volt and be shut-off.

Gate driver 803 in this structure and with this operation changes power transistor 802 sharply from the shut-off state to the conductive state, or vice versa, because a voltage is quickly applied to the gate electrode of transistor 802 due to the on-off of transistors 831 and 832. This sharp change of transistor 802 increases switching noises and sometimes invites malfunctions in peripheral devices and circuits. The increase of switching noises also sometimes deteriorates transistor 802 per se, and causes malfunctions of gate driver per se.

In order to overcome the problems discussed above, as shown in FIG. 10, resistors 101, 102, diode 103 and capacitor 107 are interposed between gate driver 803 and transistor 802, so that a speed of changing from the shut-off state to the conductive state or vice versa can be adjusted.

Interposing of those elements such as resistors 101, 102, diode 103 moderates the speed of applying a voltage to the gate electrode of transistor 802 due to the input capacitance (not shown) both of those elements and the gate electrode of transistor 802. This mechanism allows adjusting the speed of changing the shut-off state of transistor 802 to the conductive state or vice versa. This technique is disclosed in Japanese Patent Application Non-Examined Publication No. H04-230117.

However, the conventional gate driver discussed above needs a number of elements, such as the foregoing resistors and a diode, to be interposed between the gate driver and the power transistor in order to achieve the following objects: (1) adjusting the speed of changing shut-off state to conductive state or vice versa for lowering the switching noises, (2) operating the power transistor properly in order to prevent the power transistor from being deteriorated.

In the case of forming a motor driving device using the foregoing gate driver, plural power transistors 802a, 802b, 802c, 802d, 802e and 802f are needed to drive motor driving-coils 811, 813 and 815. The elements to be interposed are also needed in the quantity proportionate to the number of those power transistors. To be more specific, resistors 111, 112, 114, 115, 131, 132, 134, 135, 151, 152, 154, 155, diodes 113, 116, 133, 136, 153, 156, and capacitors 117, 118, 137, 138, 157 and 158 are needed.

As such, the conventional gate driver and the motor driving device using this conventional gate driver require a number of elements to be interposed in order to moderate the speed of changing the shut-off state to the conductive state of the power transistors or vice versa. As a result, those elements per se and assembly of those elements boost the cost, and also a layout of the printed circuit board becomes complicated and the area of the printed circuit board increases. Those factors prevent the motor driving device as well as the apparatuses using the device from being inexpensive or downsized.

To overcome the foregoing problems, transistors 831 and 832 forming gate driver 803 can be simply replaced with a constant current source. This replacement can eliminate the interposed elements such as resistors and diodes, and moderate the speed of applying a voltage to the gate electrode of transistor 802 due to the constant current value and the input capacitance of the gate electrode of transistor 802.

However, this simple replacement of transistors 831 and 832 with the constant current source limits power transistors applicable to the gate driver, so that the gate driver cannot be used to a variety of power transistors.

To be more specific, a power transistor has a capacitor structure at its gate electrode which is insulated with oxide film, and the capacitor structure forms an input capacitance. This input capacitance becomes greater as the power transistor has a greater output size, which includes the absolute max. current and withstanding voltage. In other words, an input capacitance of the gate electrode depends on an output size of the power transistor.

Therefore, the foregoing simple replacement of transistors 831 and 832 with a constant current source is applicable only to the power transistors having an input capacitance that matches with the constant current value. In the case of a power transistor having a small input capacitance, the speed of changing conductive state to shut-off state or vice versa becomes too fast, which increases switching noises. On the contrary, a power transistor having a large input capacitance reduces too much the speed of changing conductive state to shut-off state and/or vice versa, which incurs greater switching loss. In other words, only the power transistors having an input capacitance that matches with the constant current value of the constant current source are applicable.

A power transistor including a gate electrode insulated with oxide film has an input capacitance depending on the structure of its gate electrode. In general, a power transistor having a trench structure, which has been recently developed, of its gate electrode has a greater input capacitance than a conventional planer structure. Further, along with the technological progress and the cost reduction of semiconductor, a chip area of a semiconductor having the same capacitance as a conventional one becomes smaller due to finer-chip technology and a shrinking technique, so that the input capacitance also becomes smaller.

The simple replacement of transistors 831 and 832 with a constant current source is thus difficult to support a variety of gate structures of power transistors. In other words, the use of the gate driver in a motor driving device is difficult to support a variety of motor-outputs by changing an output size of a power transistor, and the use thereof is difficult to support power transistors having different structures of gate electrodes.

DISCLOSURE OF THE INVENTION

The present invention addresses the problems discussed above and aims to provide a gate driver applicable with ease to power transistors having different output sizes, and this gate driver can achieve an appropriate speed of changing shut-off state of a power transistor to conductive state and/or vice versa with a substantially small number of additional elements and at a low cost. The present invention also aims to provide a motor driving device employing the foregoing gate driver, and the motor driving device can reduce noises produced by the switching of the power transistor at PWM driving with a substantially small number of additional elements at a low cost, and this driving device can easily deal with the changes of output sizes of the motors. The present invention aims to provide apparatuses equipped with the motor driving device.

The gate driver of the present invention changes a power transistor, including a gate electrode insulated with oxide film, from conductive state to shut-off state or vice versa, the gate driver comprises the following elements:

a first current source for outputting a first current value to boost an electrical potential of the gate electrode when the power transistor changes from the shut-off state to the conductive state;

a second current source for outputting a second current value to lower the electrical potential of the gate electrode when the power transistor changes from the conductive state to the shut-off state.

The first and second current values are prepared by at least one kind of current-source control information.

The foregoing structure can achieve an appropriate speed of changing the conductive state to the shut-off state and/or vice versa with the substantially small number of elements and at a low cost, and at the same time, the foregoing gate driver is applicable with ease to driving power transistors having different output sizes.

The motor driving device of the present invention includes the foregoing gate driver. The apparatuses of the present invention include this motor driving devices. The foregoing structure of the gate driver allows the motor driving device as well as the apparatuses of the present invention to suppress noises produced by switching operation during the PWM driving by power transistors equipped to the motor driving device and the apparatuses. The gate driver of the present invention can achieve the advantage discussed above with the small number of elements, and also support the motors having a variety of output sizes and being equipped to the driving device as well as to the apparatuses.

PREFERRED EMBODIMENTS OF THE INVENTION

Exemplary embodiments of the present invention are demonstrated hereinafter with reference to the accompanying drawings. In the following descriptions, an input section receiving a gate-driver control signal, to which current-source control information is supplied, is abbreviated to an assigning terminal, and the current-source control information is replaced with a passive element (resistor) or communication information.

Exemplary Embodiment 1

Figure 1:
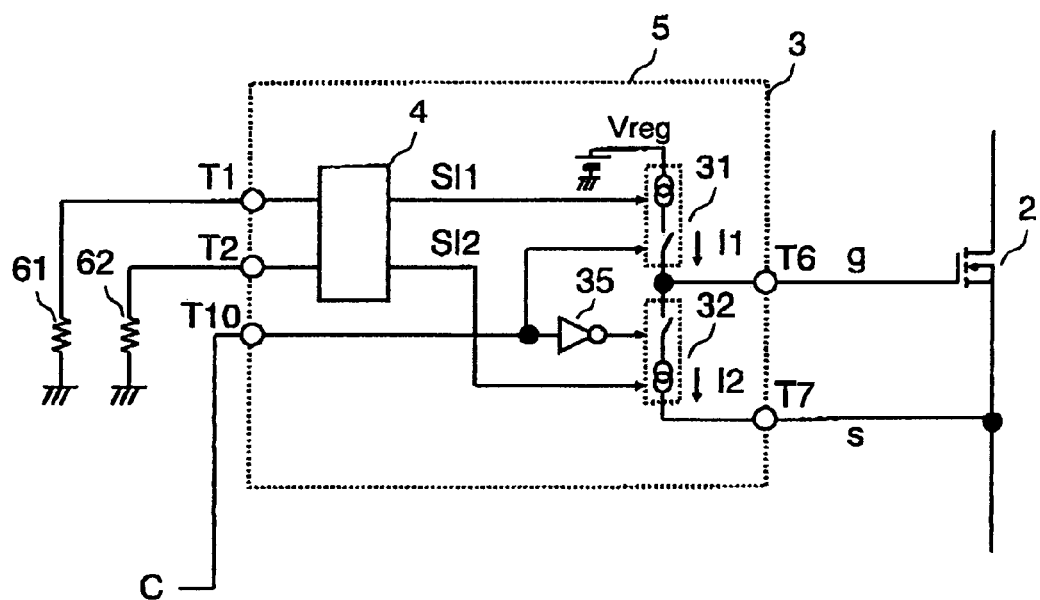
FIG. 1 shows a structure of a gate driver in accordance with a first exemplary embodiment of the present invention.

FIG. 1 shows a structure of a gate driver in accordance with the first exemplary embodiment of the present invention. In FIG. 1, power transistor 2 includes a gate electrode insulated with oxide film, and MOSFET or IGBT is well known as this type of power transistor. In the first embodiment, the MOSFET is used as an example.

Gate driver 3 has a coupler for connecting with the outside, and the coupler comprises the following elements:
  a connecting section with a gate electrode (terminal T6);
  a connecting section with a source electrode (terminal T7); and
  a cluster of input terminals that receives gate-driver control information (assigning terminal T1, assigning terminal T2, and an input terminal that receives switch control signal C (terminal T10)).

Gate driver 3 further includes the following elements as its interior structure:
  first current source 31;
  second current source 32;
  gate circuit (NOT circuit) 35; and
  current assignor 4.

Switch control signal C stays on a high level (level H) and a low level (level L) alternately.

A terminal, located on a power-supply side, (a first terminal) of first current source 31 is coupled to the inner power supply (not shown) of the gate driver, and an output terminal (a second terminal) of first current source 31 is coupled to a terminal, located on the power supply side, (a first terminal) of second current source 32. An output terminal (a second terminal) of second current source 32 is coupled to a source electrode of power transistor 2 via terminal T7. A junction point of the output terminal of first current source 31 and the terminal, located on the power supply side, of second current source 32 is coupled to the gate electrode of power transistor 2 via terminal T6.

To be more specific, gate driver 3 includes first current source 31 and second current source 32, and first current source 31 is coupled to the gate electrode of power transistor 2, and second current source 32 is coupled between the gate electrode and the source electrode of transistor 2.

Current assignor 4 acts on first current source 31 and second current source 32. Current assignor 4 includes two assigning terminals T1 and T2 which receive a gate-driver control signal. Terminals T1 and T2 are coupled with passive elements (resistors 61 and 62) as an input of the current-source control information.

Switch control signal C acts on first current source 31, and a reversal signal of signal C acts on second current source 32. Meanwhile, signal C is reversed by gate circuit 35. Signal C is fed into terminal T10, and then acts on first and second current sources 31, 32.

When signal C stays on level H, first current source 31 outputs first current value I1, and second current source 32 is electrically opened and does not output second current value I2. When signal C stays on level L, first current source 31 is electrically opened and does not output first current value I1. Second current source 32 outputs second current value I2.

First and second current sources 31, 32, current assignor 4 and gate circuit 35 form gate driver 3 in accordance with the first embodiment, and they can be integrated into a monolithic IC 5.

Next, an operation of the foregoing gate driver is demonstrated. First, an operation for forcing power transistor 2 into conduction is described.

The operation for forcing transistor 2 into conduction starts with putting switch control signal C on level H. When signal C turns to level H, first current source 31 outputs first current value I1, and second current source 32 is electrically opened, then current value I1 flows to the gate electrode of power transistor 2.

Transistor 2 includes the gate electrode insulated with oxide film as previously discussed, and the gate electrode has a capacitor structure, which exists both between the gate electrode and the source electrode, and between the gate electrode and the drain electrode. Those capacitor structures form input capacitance (in the case of MOSFET, the input capacitance is generally referred to as "Ciss", and in the case of IGBT, it is referred to as "Cies".)

First current value I1 flowing to the gate electrode of transistor 2 works as a charging current to the input capacitance of transistor 2, of which gate-source voltage (hereinafter simply referred to as "gate voltage") increases along with the charging to the input capacitance. When the gate voltage reaches a threshold value determined by the characteristics of transistor 2, transistor 2 starts being conductive and becomes fully conductive (on-state) in due course.

A time from an initial conduction until a full conduction, i.e., a switching time at being conductive is generally determined by current value I1 and the input capacitance of transistor 2. In other words, a switching speed (a time needed for changing a shut-off state to a conductive state) of being conductive of transistor 2 can be somewhat adjusted with current value I1.

Next, an operation for shutting off power transistor 2 is described. This operation starts with putting switch control signal C on level L. When signal C turns to level L, first current source 31 is electrically opened, and second current source 32 outputs second current value I2, which works as discharging current from the input capacitance of transistor 2. The gate voltage of transistor 2 lowers along with the discharge from the input capacitance with current value I2. When the gate voltage reaches the threshold value determined by the characteristics of transistor 2, transistor 2 starts shut-off, and becomes completely shut-off (off-state) in due course.

A time from a initial shut-off state until the complete shut-off state, i.e., a switching time at being shut-off, is determined generally by current value I2 and the input capacitance of transistor 2. In other words, a switching speed (a time needed for changing a conductive state to a shut-off state) of being shut-off of transistor 2 can be somewhat adjusted with current value I2.

The foregoing description proves that current value I1 or I2 charges or discharges the input capacitance of transistor 2, and the gate voltage increases or decreases along with the charging or the discharging, so that transistor 2 becomes conductive or shut-off. The switching speed at this being conductive or shut-off can be somewhat adjusted with current value I1 or I2.

In FIG. 1, current assignor 4 assigns current values I1 and I2. Current assignor 4 is coupled with resistor 61 via assigning terminal T1, and outputs current-assigning signal SI1 determined in response to resistor 61. First current source 31 receives signal SI1, and outputs first current value I1 in response to signal SI1. In other words, current assignor 4 assigns first current value I1, determined in response to a value of resistor 61, to first current source 31 so that current source 31 can output first current value I1. In a similar manner, current assignor 4 assigns second current value I2, determined in response to a value of resistor 62 coupled to assigning terminal T2, to second current source 32, so that current source 32 can output second current value I2.

First current value I1 is assigned by resistor 61 coupled to terminal T1, so that the switching speed of being conductive of transistor 2 can be adjusted, and second current value I2 is assigned by resistor 62 coupled to terminal T2, so that the switching speed of being shut-off of transistor 2 can be adjusted.

A capacitor can be added between the gate electrode and the source electrode, or between the gate electrode and the drain electrode, or between the drain electrode and the source electrode in order to adjust more finely the switching speed. This additional capacitor can also eliminate malfunction due to external noises.

As discussed in this first embodiment, when power transistor 2 is forced into conduction, first current source 31 outputs first current value I1 to raise the gate voltage, and when transistor 2 is forced into shut-off, second current source 32 outputs second current value I2 to lower the gate voltage. First and second current values I1 and I2 can be assigned by assigning terminals T1 and T2.

This structure allows adjusting appropriately the speed of being conductive or shut-off of the power transistor without interposing diodes and resistors between gate driver 3 and transistor 2, so that switching noises can be lowered and the transistors can be prevented from breakdown. The adjustment can be carried out by only two resistors 61 and 62 coupled to assigning terminals T1 and T2, so that the gate driver can be downsized and its cost can be reduced.

In the case of forcing power transistors having different input capacitance into conduction and shut-off, their switching speeds can be adjusted by simply replacing resistors 61 and 62 with other appropriated resistors. The present invention is thus applicable with ease to the power transistors having different output sizes.

Exemplary Embodiment 2

Figure 2:
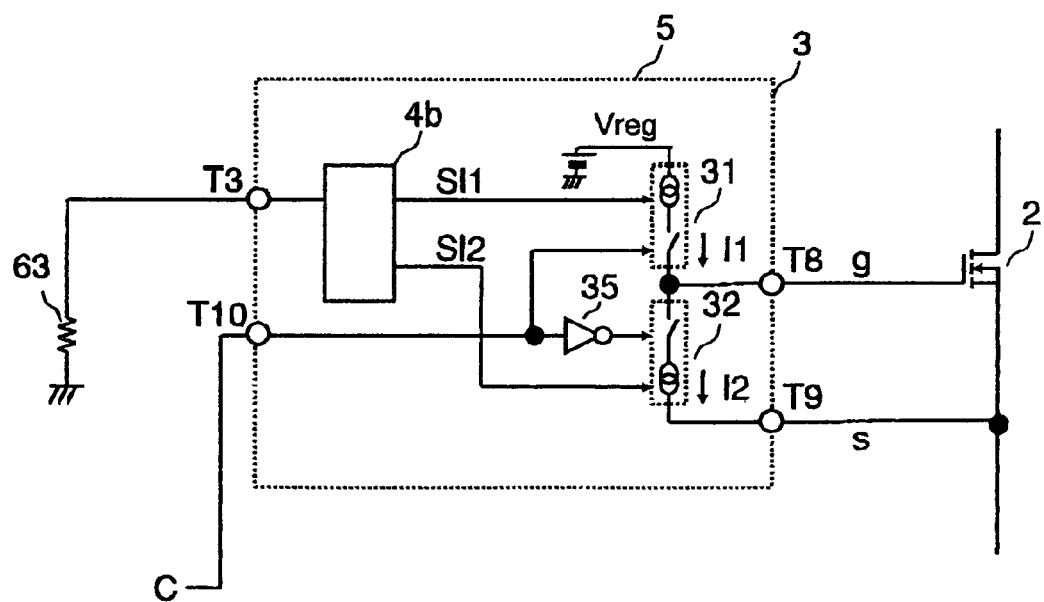
FIG. 2 shows a structure of a gate driver in accordance with a second exemplary embodiment of the present invention.

FIG. 2 shows a structure of a gate driver in accordance with the second exemplary embodiment of the present invention. In the first embodiment discussed previously, resistors 61 and 62 are coupled to two assigning terminals T1 and T2, thereby assigning first current value I1 and second current value I2. In this second embodiment, gate driver 3 includes one assigning terminal T3 coupled with resistor 63 as shown in FIG. 2, so that current values I1 and I2 are assigned.

To be more specific, current assignor 4b has a predetermined ratio of current assigning signal SI1 vs. SI2. Based on a value of resistor 63 coupled to terminal T3, current assignor 4b outputs signals SI1 and SI2 in response to the foregoing ratio. Current value I1 in response to signal SI1 is supplied to a gate electrode of power transistor 2 via terminal T8. Current value I2 in response to signal SI2 is supplied to a source electrode of transistor 2 via terminal T9. Switch control signal C supplied to terminal 10 works in a similar manner to the first embodiment.

This structure allows adjusting a time needed to change a shut-off state of transistor 2 to a conductive state and/or vice versa with only one resistor coupled to assigning terminal T3. This structure thus further downsizes the gate driver and reduces its cost.

In the first and second embodiments, a resistor is coupled to an assigning terminal for assigning current values I1 and I2; however, it is not necessarily a resistor, but a passive element such as a capacitor or an inductance can be used for obtaining a similar advantage.

Exemplary Embodiment 3

Figure 3:
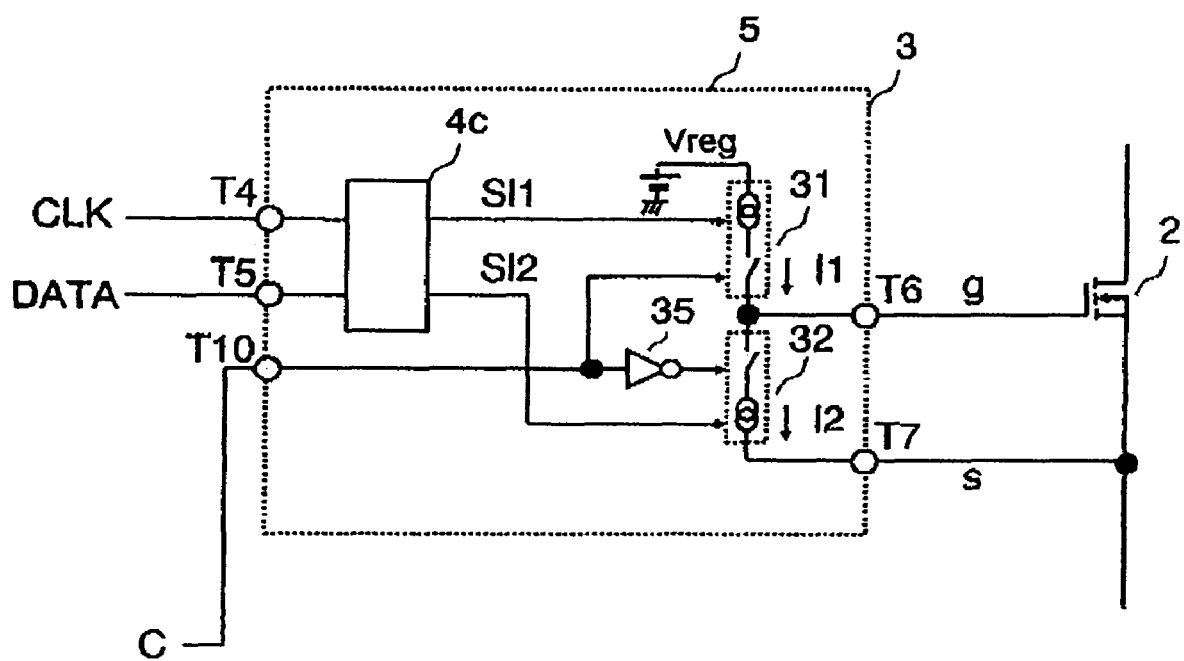
FIG. 3 shows a structure of a gate driver in accordance with a third exemplary embodiment of the present invention.

FIG. 3 shows a structure of a gate driver in accordance with the third exemplary embodiment of the present invention. In this third embodiment, for instance, terminals CLK and DATA, which receive communication information, can be used as assigning terminals T4 and T5 as shown in FIG. 3, and serial communication information is supplied to those terminals. Based on the serial communication information, current assignor 4c assigns current values I1 and I2. In FIG. 3, the input terminals CLK and DATA are used; however, there are various methods in the serial communications, for instance, only DATA terminal is prepared as an input terminal, or an enable terminal is added, so that this embodiment can be achieved in a variety of communication forms. Switch control signal C supplied to terminal 10 works in a similar manner to the first embodiment.

The third embodiment proves that a time needed to change a shut-off state of transistor 2 to a conductive state or vice versa can be prepared by communication information. In the case of power transistors having different output sizes, the hardware of gate driver can be shared, so that man-hours for managing types of model can be reduced, and resource-saving can be expected.

In the embodiments previously discussed, the time needed to change a shut-off state of a power transistor to a conductive state and/or vice versa is called differently as follows: speed of switching operation of power transistor; switching speed of power transistor; and switching speed of being conductive (or shut-off of power transistor. Those terms express a change from a shut-off state to a conductive state and/or vice versa of a power transistor, and a transitional state between those two states.

Exemplary Embodiment 4

Figure 4:
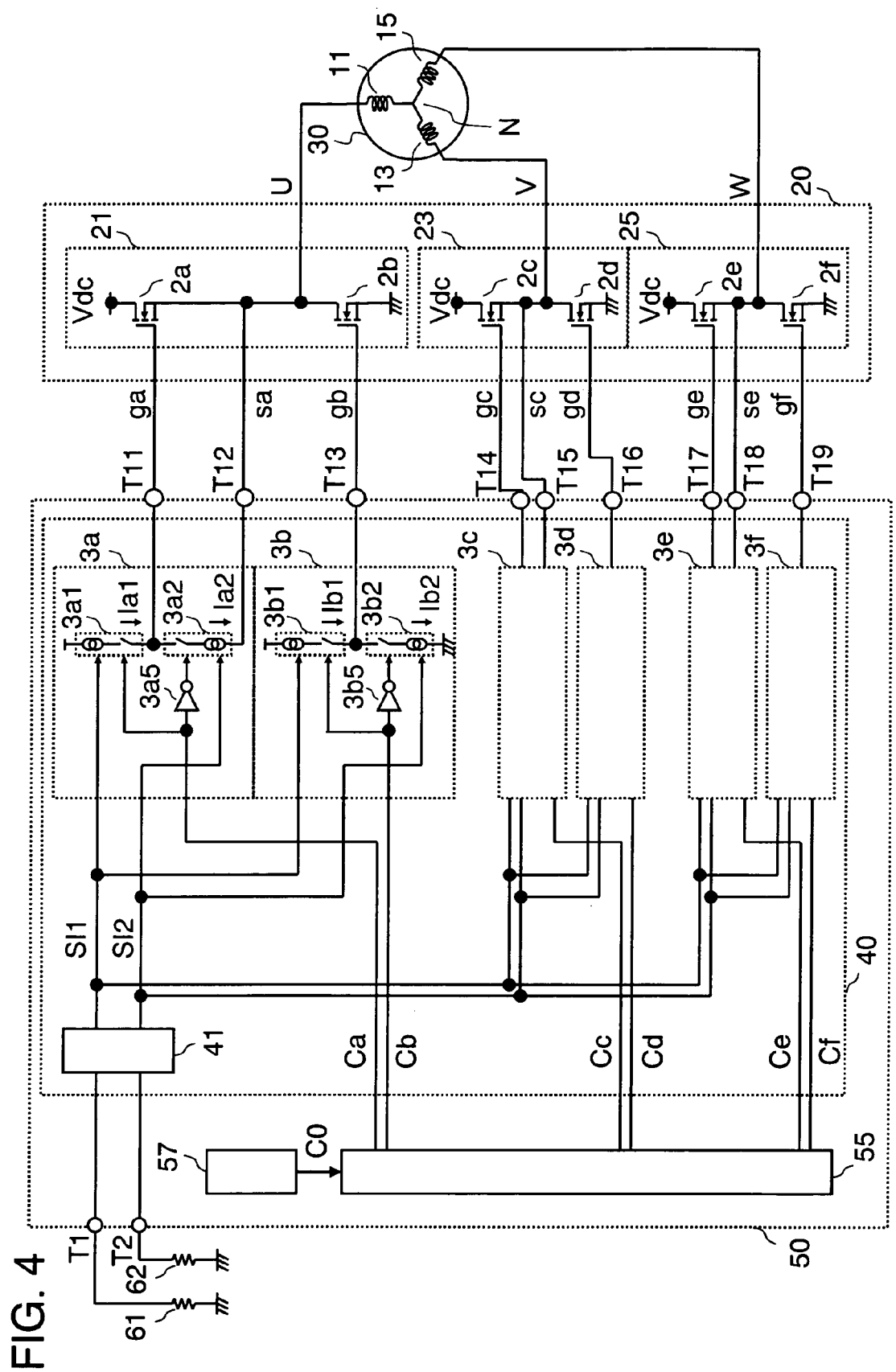
FIG. 4 shows a structure of a motor driving device in accordance with a fourth exemplary embodiment of the present invention.

FIG. 4 shows a structure of a motor driving device in accordance with the fourth exemplary embodiment of the present invention. A gate driver included in the motor driving device in accordance with this fourth embodiment is the gate driver described in the first embodiment, thus duplication of the description is eliminated here.

In FIG. 4, three-phase driving coils 11, 13 and 15 of motor 30 are coupled to inverter 20 in the following way: Inverter 20 includes power transistors 2a, 2b, 2c, 2d, 2e and 2f. Transistors 2a and 2b are coupled in series with respect to dc power supply Vdc as shown in dotted block 21. The junction point of this series connection is coupled with phase-U driving coil 11. In a similar way, transistors 2c and 2d are coupled in series with respect to dc power supply Vdc as shown in dotted block 23. The junction point of this series connection is coupled with phase-V driving coil 13. Transistors 2e and 2f are coupled in series with respect to dc power supply Vdc as shown in dotted block 25. This junction point is coupled with phase-W driving coil 15. Meanwhile, the common junction point of driving coils 11, 13 and 15 forms neutral point N.

Transistors 2a, 2c and 2e are the first power transistors and form an upper arm of inverter 20, and transistors 2b, 2d and 2f are the second power transistors and form a lower arm of inverter 20. Each one of the power transistors includes a gate electrode insulated with oxide film, and a MOSFET is used here as an example as it is used also in the first embodiment.

Gate drivers 3a, 3c and 3e have an identical structure, and are coupled to respective gate electrodes and source electrodes of first power transistors 2a, 2c and 2e via terminal T11, T12, T14, T15, T17 and T18. Gate drivers 3b, 3d and 3f have an identical structure, and are coupled to respective gate electrodes of second power transistors 2b, 2d and 2f via terminal T13, T16 and T19.

Each one of gate drivers 3a, 3b, 3c, 3d, 3e and 3f is equal to gate driver 3 without current assignor 4 shown in FIG. 1, and respective first current values Ia1, Ib1, Ic1, Id1, Ie1, and If1 share current assigning signal SI1, which is supplied from current assignor 41. First current values Ic1, Id1, Ie1 and If1 are not shown, but they are identical to Ia1 and Ib1. In a similar manner, respective second current values Ia2, Ib2, Ic2, Id2, Ie2, and If2 share current assigning signal SI2, which is supplied from current assignor 41. Second current values Ic2, Id2, Ie2 and If2 are not shown, but they are identical to Ia2 and Ib21.

Gate drivers 3a, 3b, 3c, 3d, 3e and 3f receive switch control signals Ca, Cb, Cc, Cd, Ce and Cf which work in a similar way to switch control signal C shown in FIG. 1 of the first embodiment, and those signals are supplied from PWM controller 55, and stay on level H (high level signal) and level L (low level signal) alternately. PWM controller 55 receives command signal Co from control instruction section 57.

Gate drivers 3a, 3b, 3c, 3d, 3e, 3f, current assignor 41, PWM controller 55 and control instruction section 57 are integrated into monolithic IC 50, so that assigning terminals T1 and T2 coupled to current assignor 41 are terminals of monolithic IC 50. Assigning terminals T1 and T2 are coupled with resistors 61 and 62 which are externally mounted to IC 50.

An operation of the motor driving device discussed above is demonstrated hereinafter. Control instruction section 57 outputs command signal Co for instructing the motor to spin at a desirable rpm, or instructing to apply a voltage to the driving coils, or instructing to pass a driving current (torque instruction) through the driving coils of the motor. PWM controller 55 outputs switch control signals Ca, Cb, Cc, Cd, Ce and Cf in order to supply power to respective phase-coils 11, 13 and 15 of the motor in response to command signal Co.

Control signals Ca and Cb are responsible for phase-U driving coil 11, and these signals force power transistors 2a and 2b coupled to coil 11 into conduction or shut-off via gate drivers 3a and 3b. Signals Ca and Cb are formed by superposing a PWM signal having a rather high frequency (e.g., ranging from several kHz to several hundreds kHz) onto a primary signal (ranging from several Hz to several kHz) produced depending on a position of a mover of the motor. The mover is referred to as a rotor hereinafter. The PWM signal is a pulse width modulation signal, and its pulse width is adjusted by signal Co, thereby regulating a power amount to be supplied to the driving coils.

Signals Cc and Cd are responsible for phase-V driving coil 13, and work in a similar way to signals Ca and Cb discussed above. Signals Ce and Cf are responsible for phase-W driving coil 15, and work in a similar way to signals Ca and Cb. Respective primary signals of the foregoing three groups of signals have phase-difference of 120 degrees in electrical angles from each other, so that respective driving coils 11, 13 and 15 are driven sequentially for driving the motor. The rpm of the motor can be controlled flexibly in response to a pulse width of the PWM signal superposed on the primary signals.

What is discussed above describes a basic operation of the motor driving device. Next, operations of gate drivers 3a, 3b, 3c, 3d, 3e, 3f and current assignor 41 are demonstrated hereinafter.

In FIG. 4, gate drivers 3a, 3b, 3c, 3d, 3e, and 3f have basically an identical structure and operate in the same way. The following description thus only refers to gate driver 3a, and descriptions of other gate drivers are omitted.

Gate driver 3a is basically the same as gate driver 3 used in the first embodiment. Only the difference is that current assignor 41 is prepared outside of gate driver 3a because current assigning signals SI1 and SI2 are shared by gate drivers 3a, 3b, 3c, 3d, 3e and 3f. There is no essential difference between gate drivers 3a and 3.

Gate driver 3a forces power transistor 2a into conduction when switch control signal Ca stays on level H, and shuts down transistor 2a when signal Ca stays on level L. This is the same operation as gate driver 3 shown in FIG. 1. To be more specific, when signal Ca stays on level H, first current source 3a1 outputs current value Ia1. At this time, second current source 3a2 is electrically opened. Current value Ia1 works as a charging current to an input capacitance existing in the gate electrode of first power transistor 2a, and raises the gate voltage, thereby forcing transistor 2a into conduction. When signal Ca stays on level L, second current source 3a2 outputs second current value Ia2, at this time, first current source 3a1 is electrically opened. Current value Ia2 works as a discharging current from the input capacitance of transistor 2a, and lowers the gate voltage, thereby shuts off first power transistor 2a.

As such, first current value Ia1 or second current value Ia2 charges or discharges the input capacitance of the first power transistor 2a, and the charge or discharge raises or lowers the gate voltage, so that transistors 2a becomes conductive or shut-off.

The switching speed at being conductive or being shut-off can be somewhat adjusted with current values Ia1 or Ia2. This is the same as the first embodiment.

The foregoing current values Ia1 and Ia2 are assigned in response to current assigning signals SI1 and SI2 supplied from current assignor 41, and signals SI1 and SI2 are supplied in response to resistors 61 and 62 coupled to assigning terminals T1 and T2. In other words, current values Ia1 and Ia2 are supplied depending on the values of resistors 61 and 62 to be coupled to terminals T1 and T2.

Therefore, resistors 61 and 62 can adjust the time needed for changing the shut-off state of first power transistor 2a to the conductive state and/or vice versa. The description about gate driver 3a is applicable to other gate drivers 3b, 3c, 3d, 3e and 3f.

The switching speeds of power transistors 2b, 2c, 2d, 2e and 2f corresponding to gate drivers 3b, 3c, 3d, 3e and 3f are the same as that of first power transistor 2a because signals SI1 and SI2, which assign first and second current values, are shared by the respective gate drivers. In other words, resistors 61 and 62 coupled to terminal T1 and T2 can adjust the switching speeds of all power transistors generally at the same value, and the adjustment can be carried out by one operation from the outside of monolithic IC 50.

As discussed above, in the fourth embodiment, power transistors 2a, 2b, 2c, 2d, 2e, and 2f, which drive driving-coils 11, 13 and 15 of the motor, are equipped correspondingly with gate drivers 3a, 3b, 3c, 3d, 3e and 3f that work basically in the same manner as gate driver 3 used in the first embodiment. All or parts of those gate drivers are integrated into a monolithic IC, and the first and second current values supplied from respective gate drivers can be assigned with two assigning terminals T1 and T2 by one operation from the outside of the monolithic IC.

Figure 11:
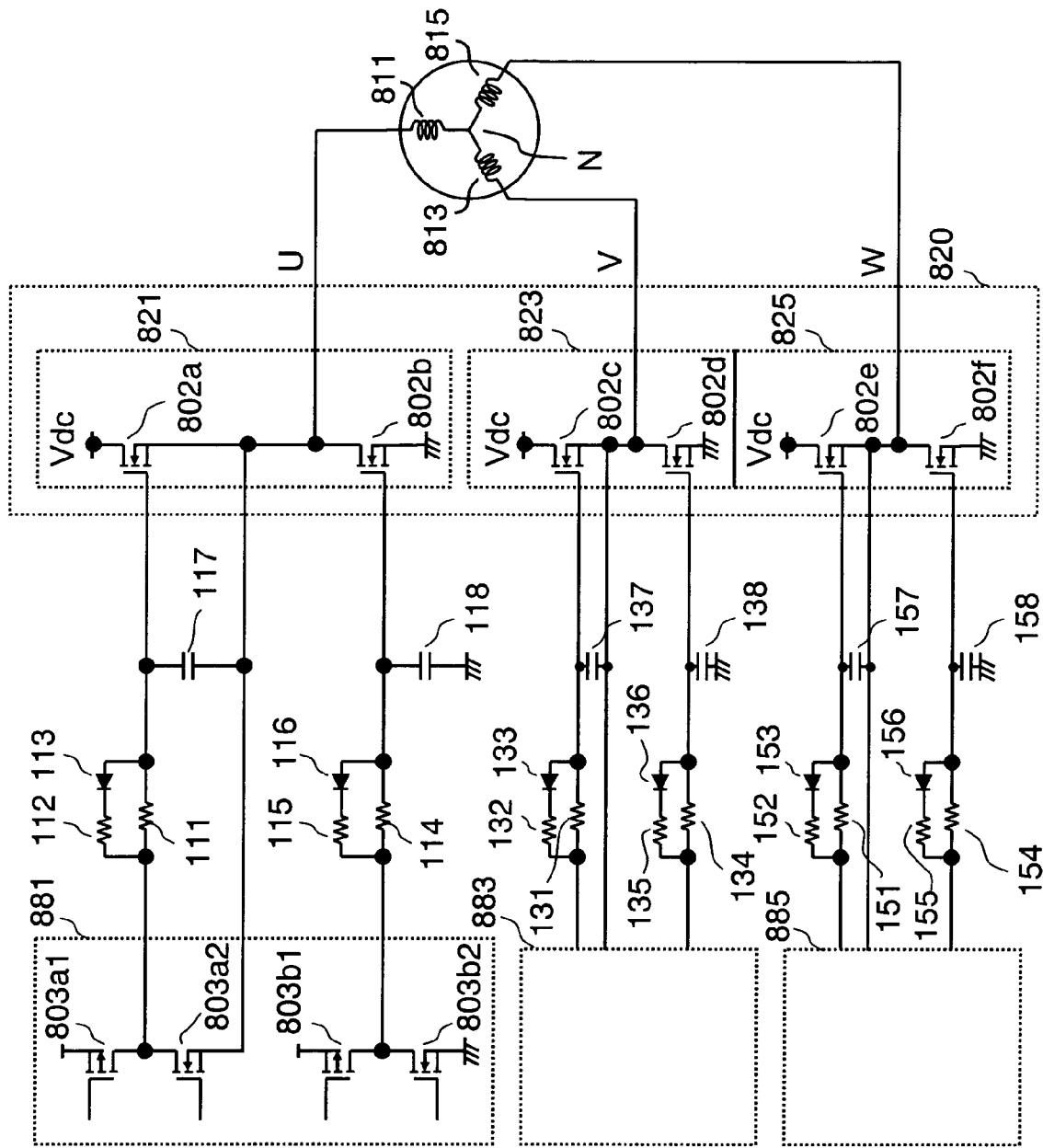
FIG. 11 shows a structure of a conventional motor driving device.

This structure can save the diodes and resistors added to each power transistor as described about the prior art shown in FIG. 11, and allows only two resistors 61 and 62 coupled to assigning terminals T1 and T2 to adjust the switching speeds of all the power transistors by one operation. As a result, the motor driving device can be downsized and its cost can be reduced.

The speed of changing the conductive state to the shut-off state of the power transistor or vice versa is thus adjusted appropriately, so that switching noises produced at PWM driving of the motor can be reduced and the power transistor per se can be protected against breakdown.

In the case of forcing power transistors having a variety of input capacitance into conduction or shut-off, the switching speeds can be adjusted only by replacing resistors 61 and 62 with appropriate ones. Therefore, the present invention is applicable with ease to the power transistors having different output sizes. In other words, the motor driving device of the present invention can be used to motors of various output sizes.

Exemplary Embodiment 5

Figure 5:
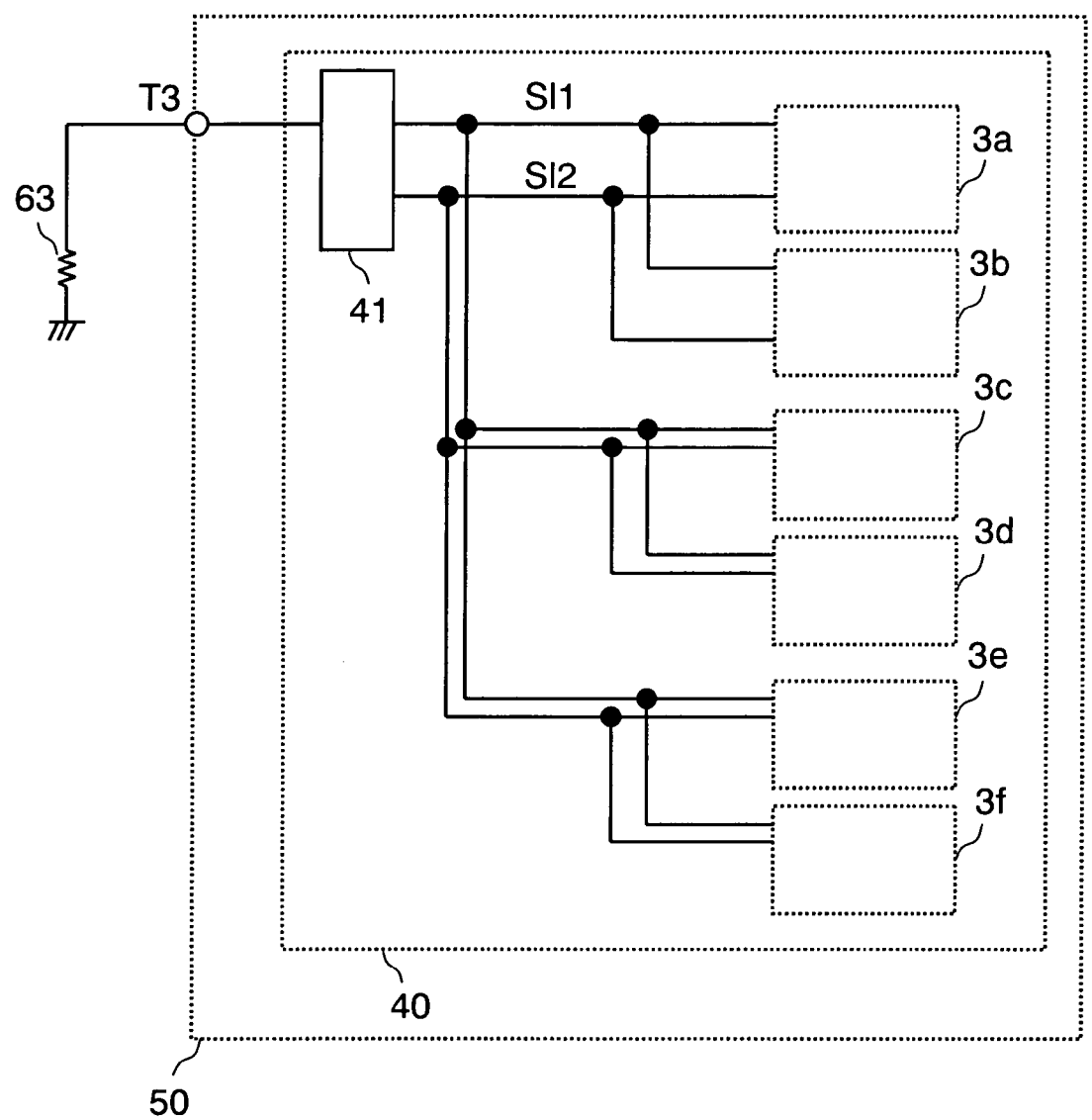
FIG. 5 shows a structure of an assigning terminal of a motor driving device in accordance with a fifth exemplary embodiment of the present invention.

FIG. 5 shows a structure of an assigning terminal of a motor driving device in accordance with the fifth exemplary embodiment of the present invention. In the foregoing fourth embodiment, resistors 61 and 62 are coupled to assigning terminals T1 and T2, so that the first and second current values are assigned. In this fifth embodiment, however, one resistor 63 is coupled to one assigning terminal T3, thereby assigning the first and second current values.

To be more specific, in the fifth embodiment, current assignor 41 has a predetermined ratio of current assigning signal SI1 vs. SI2. Current assignor 41 outputs signals SI1 and SI2 depending on a value of resistor 63 coupled to terminal T3. Gate driver 3a outputs current values in response to signals SI1 and SI2 to a gate electrode and a source electrode of a first power transistor (not shown). Gate driver 3b outputs current values in response to signals SI1 and SI2 to a gate electrode of a second power transistor (not shown). Gate drivers 3c, 3d, 3e and 3f operate in a similar way to gate drivers 3a and 3b discussed above.

This structure allows only one resistor coupled to assigning terminal T3 to adjust a time needed for changing the shut-off state of the power transistor to the conductive state and/or vice versa, so that the motor driving device can be further downsized and its cost can be further reduced.

In the fourth and fifth embodiments, a resistor is coupled to an assigning terminal for assigning a first and second current values; however, it is not necessary to use a resistor, and other passive elements such as a capacitor or an inductor can be used instead of a resistor for obtaining a similar advantage.

Exemplary Embodiment 6

Figure 6:
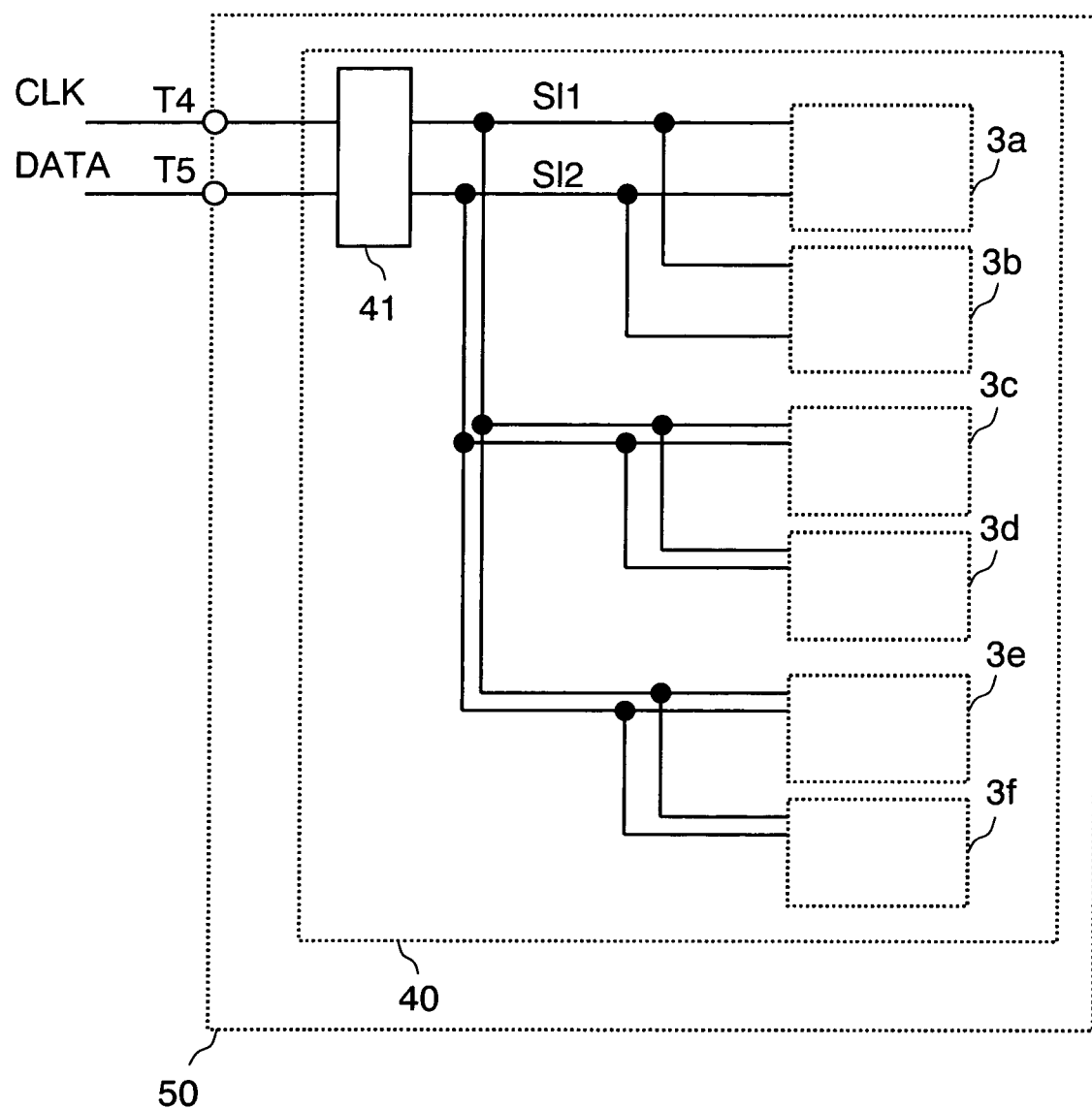
FIG. 6 shows a structure of an assigning terminal of a motor driving device in accordance with a sixth exemplary embodiment of the present invention.

FIG. 6 shows a structure of an assigning terminal of a motor driving device in accordance with the sixth exemplary embodiment of the present invention. As shown in FIG. 6, terminals CLK and DATA, which receive communication information, are used as assigning terminals T4 and T5, and serial communication information fed into those terminals can assign first and second current values. This structure allows the communication information to assign a time needed to changing a shut-off state of a power transistor to a conductive state and/or vice versa. In the case of power transistors having different output sizes, the hardware of gate driver can be shared, so that man-hours for managing types of model can be reduced, and resource-saving can be expected.

There are various methods in the serial communications, e. g., only DATA terminal is prepared as an input terminal, or an enable terminal is added, so that this embodiment can be achieved in a variety of communication forms.

Exemplary Embodiment 7

Figure 7:
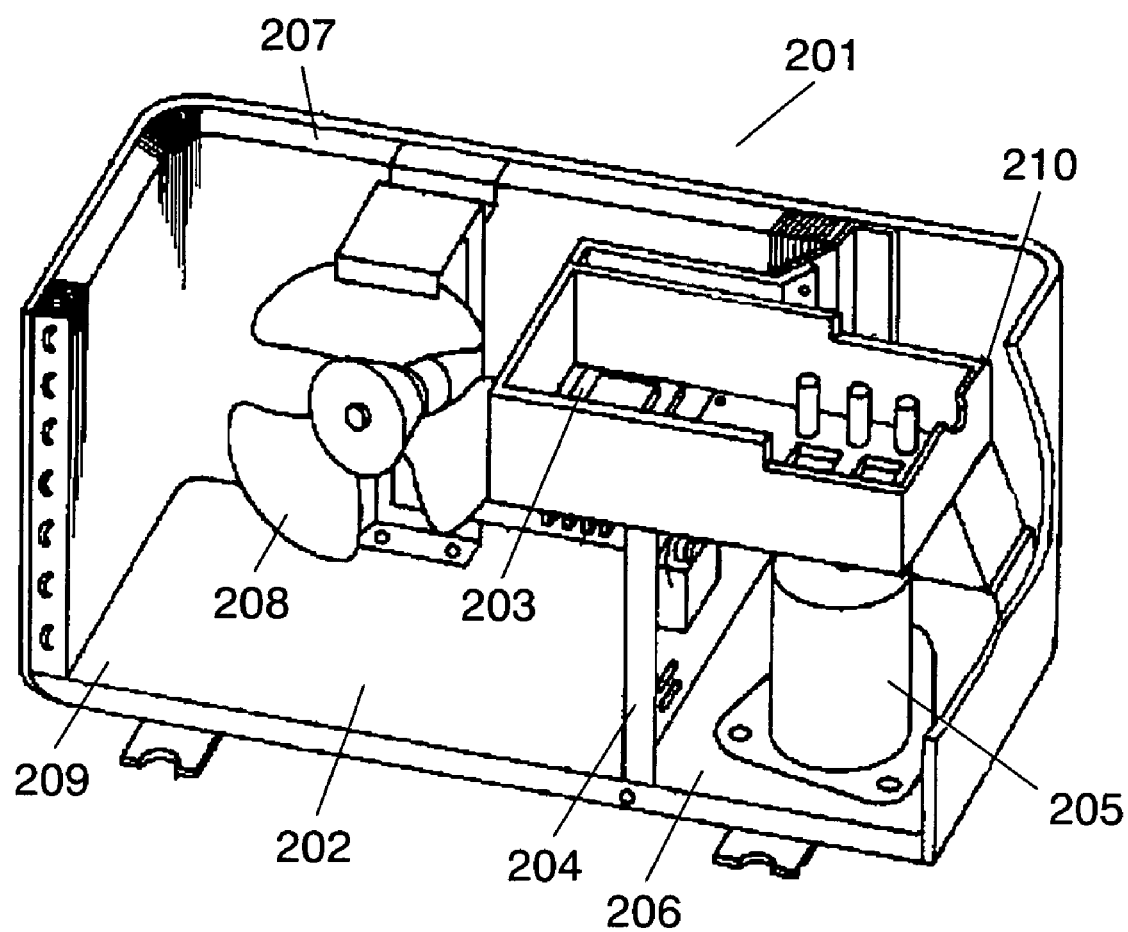
FIG. 7 shows a structure of an air-conditioner (outdoor unit), including a fan motor driven by the motor driving device of the present invention, in accordance with a seventh exemplary embodiment of the present invention.

FIG. 7 shows a structure of an air-conditioner (outdoor unit), having a fan motor which uses the motor driving device of the present invention, in accordance with the seventh exemplary embodiment of the present invention. In FIG. 7, outdoor unit 201 is divided into compressor room 206 and heat exchanger room 209 by partition 204 disposed on bottom plate 202. In compressor room 206, compressor 205 is placed, and in heat exchanger room 209, heat exchanger 207 and blowing fan motor 208 for cooling heat exchanger 207 are placed. On partition 204, box 210 containing electronic devices is placed.

Fan motor 208 is formed of a blowing fan mounted to a rotary shaft of a brushless DC motor, and driven by motor driving device 203 accommodated in box 210. Driving fan motor 208 entails the blowing fan to spin for cooling heat exchanger room 209.

The motor driving devices described in the fourth through sixth embodiments previously discussed can be used as motor driving device 203, so that the air-conditioner (outdoor unit) including the motor driving device of the present invention enjoy the advantages of those motor driving devices in accordance with the fourth through sixth embodiment of the present invention.

Exemplary Embodiment 8

Figure 8:
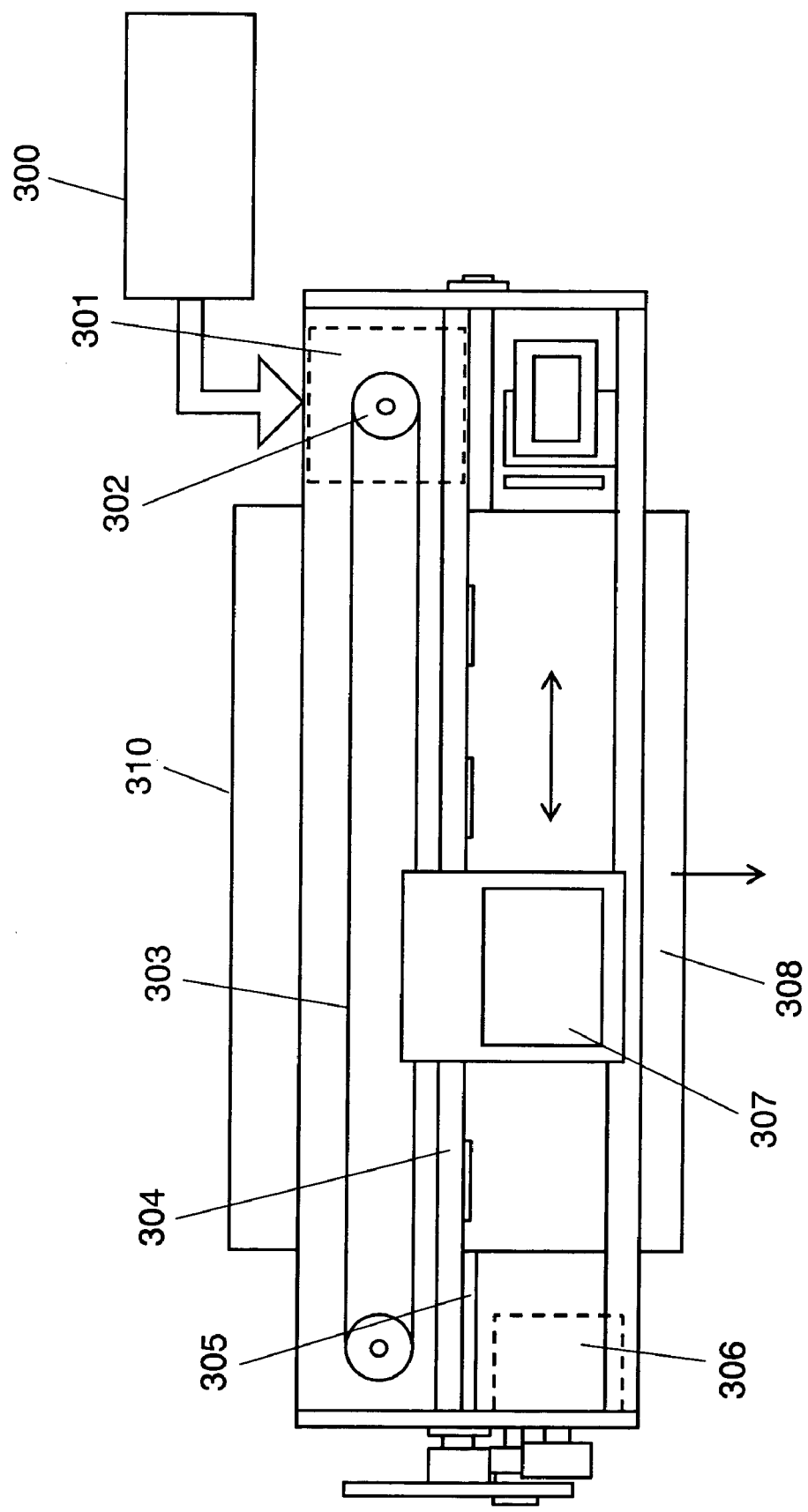
FIG. 8 shows a structure of an inkjet printer, having the motor driving device of the present invention in the driving system, in accordance with an eighth exemplary embodiment of the present invention.
Figure 9:
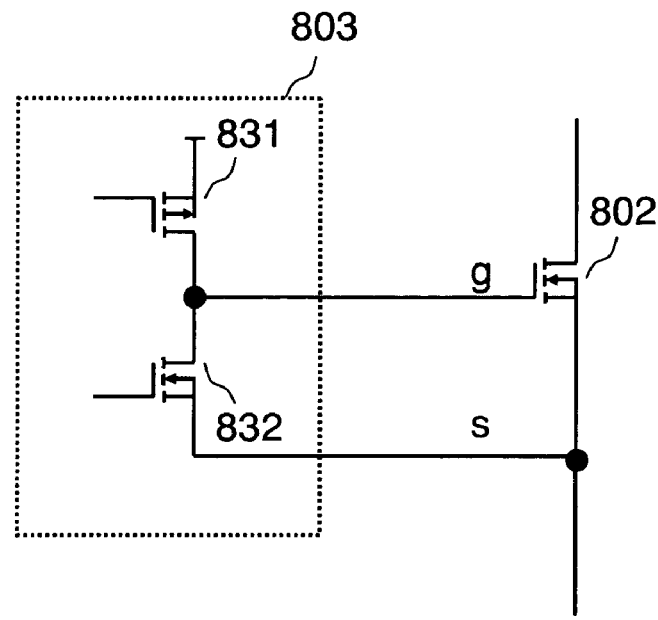
FIG. 9 shows a structure of a conventional gate driver.
Figure 10:
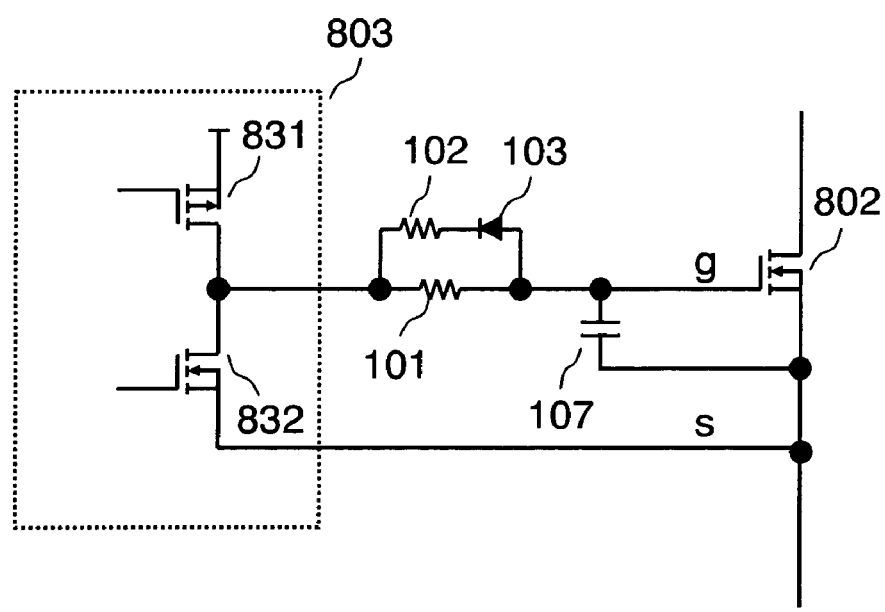
FIG. 10 shows a structure of another conventional gate driver.

FIG. 8 shows a structure of an inkjet printer, having the motor driving device of the present invention in its driving system, in accordance with an eighth exemplary embodiment of the present invention. In FIG. 8, inkjet printer (hereinafter simply referred to as a printer) 310 includes a driving system which comprises the following elements:
  carriage motor 301 for making printing head 307, mounted to a carriage, scan a paper; and
  paper feeding motor 306 for feeding a sheet of archival paper.

Carriage motor 301 is a brushless dc motor driven by motor driving device 300, and paper feeding motor 306 is a stepping motor.

Rotation of paper feeding motor 306 transfers its rotating force to paper-feeding roller 305, which feeds paper 308 toward this side of the drawing. Carriage motor 301 has pulley 302 at its rotary shaft, and timing belt 303 is looped over pulley 302. Printing head 307 is mounted to belt 303, and a nozzle of head 307 discharges liquid ink onto paper 308. The rotation of carriage motor 301 in a forward or a reverse direction has printing head 307 scan, via the pulley and the belt, right or left on FIG. 8. Printing head 307 scans paper 308 and discharges the ink onto paper 308, and paper 308 is fed, so that an image is formed on paper 308.

The motor driving devices can be used as motor driving device 300, so that the printer including the motor driving device of the present invention can enjoy the advantages of the motor driving device in accordance with the fourth through sixth embodiments of the present invention.

Other than the apparatuses described in the seventh and eighth embodiments, the following apparatuses are suitable for using the motor driving device of the present invention: copying machine, optical medium apparatus, hard disc apparatus, air-conditioner (indoor unit), air cleaner, hot-water supply, refrigerator, vacuum cleaner, washing machine, FA apparatus, and general-use inverter apparatus.

As discussed previously, the gate driver of the present invention includes a first current source and a second current source. The first current source outputs a first current value, thereby increasing a gate voltage and forcing a power transistor into conduction, and the second current source outputs a second current value, thereby lowering the gate voltage and forcing the power transistor into shut-off. The first and second current values can be assigned by at least one assigning terminal.

This structure allows adjusting appropriately a time needed for changing a shut-off state of the power transistor to a conductive state and/or vice versa with a small number of elements, so that the gate driver can be downsized and its cost can be reduced. The gate driver of the present invention can be used with ease for driving power transistors having different output sizes. The first and second current values can be assigned by communication information through the assigning terminal, so that the power transistors having different output sizes or different electrode structures can share the hardware of the gate driver. As a result, man-hours for managing model-types can be reduced, and resource-saving can be expected.

The motor driving device of the present invention prepares a plurality of the gate drivers of the present invention corresponding to a plurality of power transistors which drive the motor's driving coils. All or parts of the plural gate drivers are integrated into a monolithic IC, and respective first and second current values of each gate driver can be assigned with at least one assigning terminal by one operation from the outside of the monolithic IC.

This structure allows reducing the switching noises produced when the motor is driven by PWM driving method with a small number of elements, so that the motor driving device can be downsized and its cost can be reduced. The motor driving device of the present invention can be used in a variety of motors by changing the output sizes with ease of the power transistors. The first and second current values can be assigned by communication information through the assigning terminal, so that power the transistors having different output sizes or different electrode structures can share the hardware of the motor driving device. As a result, man-hours for managing model-types can be reduced, and resource-saving can be expected.

Since the motor driving device of the present invention can be used in a variety of motors, the motor driving device can be incorporated with ease into driving systems of various apparatuses such as information apparatuses, home appliances, industrial equipment, and FA apparatuses. Those apparatuses incorporating the motor driving device of the present invention can be downsized, and their costs as well as noises can be reduced.

What is claimed is:

1. A gate driver for forcing a power transistor having a gate electrode insulated with oxide film and also having an input capacitance between the gate electrode and the source electrode, into a conductive state or a shut-off state, the gate driver comprising:
  a first current source configured to receive a first control signal and to output a first current value to charge said input capacitance and raise an electric potential of the gate electrode in a time corresponding to a charging time of said input capacitance, when changing the power transistor from the shut-off state to the conductive state, the first current value depending on a level of the first control signal; and
  a second current source configured to receive a second control signal and to output a second current value to discharge said input capacitance and lower the electric potential of the gate electrode in a time corresponding to the charging time of said input capacitance, when changing said power transistor from the conductive state to the shut-off state, the second current value depending on a further level of the second control signal;
  wherein the respective levels of the first control signal and the second control signal are independently controllable,
  and wherein the time of change from the shut-off state to the conductive state of the power transistor is controlled by controlling the rise time of the electric potential of said gate electrode with the first current value set with the first control signal, while the time of change from the conductive state to the shut-off state of the power transistor is controlled by controlling the fall time of the electric potential of said gate electrode with said second current value set with the second control signal.

2. A gate driver to be coupled to a gate electrode and a source electrode of a power transistor including the gate electrode insulated with oxide film, the gate driver comprising:
a coupler to be coupled to outside of the gate driver, the coupler including a connecting section to the gate electrode, a connecting section to the source electrode, and a cluster of input terminals for receiving a gate-driver control signal; and
an interior structure including a first current source, a second current source, a gate circuit which is a NOT circuit, and a current assignor,
wherein the first current source and the second current source are assigned their current values by an output signal supplied from the current assignor, and their outputs are controlled by a switch-control signal supplied via one of the input terminals that receive a gate-driver control signal,
wherein the current assignor receives at least one kind of current-source control information via each one of the input terminals except the one through which the switch-control signal is supplied, and a group of output signals of the current assignor are controlled based on the current-source control information;
wherein the gate circuit, which is a NOT circuit, inverts the switch-control signal that controls the second current source;
wherein a first terminal of the first current source is coupled to a power supply of the gate driver, and a second terminal of the first current source is coupled to a first terminal of the second current source, and a second terminal of the second current source is coupled to the source electrode of the power transistor via the connecting section to the source electrode;
wherein a junction point of the second terminal of the first current source and the first terminal of the second current source is coupled to the gate electrode of the power transistor via the connecting section to the gate electrode;
wherein the first current value to be supplied from the first current source is assigned based on a portion of the current-source control information and the second current value to be supplied from the second current source is assigned based on a further portion of the current-source control information,
in a case of the switch-control signal being a high level signal, the first current source outputs the first current value and the second current source is electrically opened and does not output the second current value, and the first current value is fed into the gate electrode of the power transistor for becoming a charging current of input capacitance of the power transistor, and the charge by the charging current to input capacitance raises a voltage between the gate electrode and the source electrode of the power transistor up to a threshold voltage, then conduction becomes available between a drain electrode of the power transistor and the source electrode, and a time needed for changing a shut-off state of the power transistor to a conductive state is controlled based on a group of the current-source control information,
in a case of the switch-control signal being a low level signal, the first current source is electrically opened and does not output the first current value and the second current source outputs the second current value, so that electron charges charged in the input capacitance of the power transistor become a discharging current to the first terminal of the second power source, and the discharge due to the discharging current from the input capacitance lowers the voltage between the gate electrode and the source electrode of the power transistor down to a threshold voltage, then the drain electrode and the source electrode of the power transistor are forced to be shut-off, and a time needed for changing the conductive state of the power transistor to the shut-off state is controlled based on the group of current-source control information.

3. The gate driver of claim 1, wherein the first current source and the second current source are formed by at least a monolithic integrated circuit, and at least one piece of current-source control information supplied from outside of the monolithic integrated circuit assigns the first current value and the second current value.

4. The gate driver of claim 2, wherein the first current source and the second current source are formed by at least a monolithic integrated circuit, and at least one piece of current-source control information supplied from outside of the monolithic integrated circuit assigns the first current value and the second current value.

5. The gate driver of claim 1, wherein the current-source control information is fed into two input terminals that receive a gate-driver control signal, and each one of the input terminals is coupled with a passive element which assigns the first and the second current values respectively.

6. The gate driver of claim 2, wherein the current-source control information is fed into two input terminals of the cluster of input terminals that receive a gate-driver control signal, and each one of the input terminals is coupled with a passive element which assigns the first and the second current values respectively.

7. The gate driver of claim 1, wherein the current-source control information is fed into only one input terminal, which receives a gate-driver control signal, coupled to a passive elements, and a ratio of the first current value vs. the second current value is predetermined, so that a value of the passive element assigns either one of the first or the second current value.

8. The gate driver of claim 2, wherein the current-source control information is fed into only one input terminal, which receives a gate-driver control signal, coupled to a passive elements, and a ratio of the first current value vs. the second current value is predetermined, so that a value of the passive element assigns either one of the first or the second current value.

9. The gate driver of claim 3, wherein the current-source control information is fed into at least one input terminal that receives a gate-driver control signal, and the current-source control information is communication information supplied from outside of the gate driver, and the first and the second current values are assigned based on the communication information.

10. The gate driver of claim 4, wherein the current-source control information is fed into at least one input terminal that receives a gate-driver control signal, and the current-source control information is communication information supplied from outside of the gate driver, and the first and the second current values are assigned based on the communication information.

* * * * *